United States Patent
Ohazama (10) Patent No.: US 6,937,004 B2
(45) Date of Patent: Aug. 30, 2005

(54) TEST MARK AND ELECTRONIC DEVICE INCORPORATING THE SAME

(75) Inventor: Hidetaka Ohazama, Yamagata-ken (JP)

(73) Assignee: Tohoku Pioneer Corporation, Yamagata-ken (JP)

( * ) Notice: Subject to any disclaimer, the term of this patent is extended or adjusted under 35 U.S.C. 154(b) by 18 days.

(21) Appl. No.: 10/263,832

(22) Filed: Oct. 4, 2002

(65) Prior Publication Data

US 2003/0155908 A1 Aug. 21, 2003

(30) Foreign Application Priority Data

Feb. 20, 2002 (JP) ........................................ 2002-042558

(51) Int. Cl.⁷ ............................................... H05K 5/00
(52) U.S. Cl. ................................. 324/158.1; 361/756
(58) Field of Search ........................... 324/158.1, 500, 324/537, 758; 349/149–152; 361/736, 784, 802, 803, 756

(56) References Cited

U.S. PATENT DOCUMENTS 4,721,365 A  *  1/1988  Nishimura ................... 349/152
4,949,035 A  *  8/1990  Palmer, II. ................... 324/758
6,239,590 B1 *  5/2001  Krivy et al. ............. 324/158.1

* cited by examiner

Primary Examiner—Vinh Nguyen
Assistant Examiner—Russell M. Kobert
(74) Attorney, Agent, or Firm—Arent Fox, PLLC.

(57) ABSTRACT

A test mark is provided, for use in an inspection after a display panel, TAB tapes, and a flexible board have been connected together. Defective panels can be rejected with high accuracy in the simple inspection, thereby mitigating the burden on the microscopic inspection. At a predetermined distance from each of connection areas for connecting a panel substrate, TAB tapes, and a flexible board, there are provided test marks with at least one on each component. The electrical connection is tested between each pair of the test marks to thereby determine whether the interconnection is in a good state.

12 Claims, 7 Drawing Sheets

TEST MARK AND ELECTRONIC DEVICE INCORPORATING THE SAME

BACKGROUND OF THE INVENTION

The present invention relates to a test mark which is provided on a connection for interconnecting at least two of a panel substrate, TAB tape, and flexible board of a display panel to easily check for any defect in the connection, and also relates to an electronic device with a display panel, a TAB tape, or a flexible board which are provided with this test mark thereon.

The present application claims priority from Japanese Application No. 2002-42558, the disclosure of which is incorporated herein by reference for all purposes.

As portable telephones and portable digital assistants (PDAs) have become widely available, small and thin display panels with a high display capability have been increasingly demanded. Liquid crystal display panels or organic EL (electroluminescent) display panels have been employed as the display panel which meet the demand.

To improve the display capability of such a display panel, it is critical to mount electronic components with high accuracy on the display panel as well as to improve the optical controllability and light-emitting property of each display element.

Figure 9:
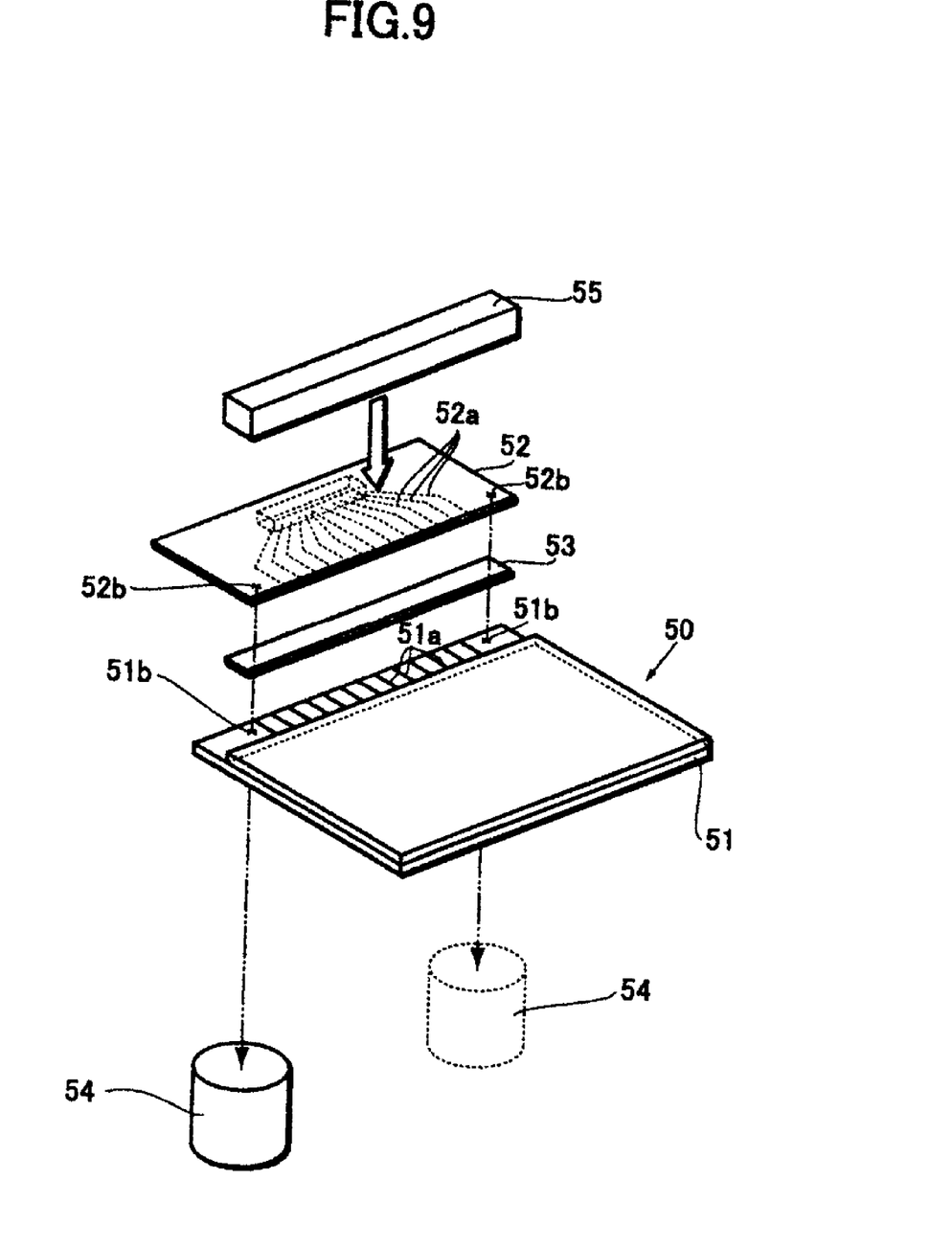
FIG. 9 is an explanatory view illustrating electronic components to be mounted on a conventional display panel.

Referring now to FIG. 9, a process for mounting electronic components on the aforementioned display panel is described below. By way of example, among the electronic components which are connected to the display panel, such as a TAB (Tape Automated Bonding) tape or FPC (Flexible Printed Circuit) board, described in this embodiment is the TAB tape to be connected to the display panel.

A panel substrate 51 of a display panel 50 has leads 51a extending from the display panel 50 to an end portion thereof. Leads 52a of a TAB tape 52 are connected to the leads 51a via an ACF (Anisotropic Conductive Film) 53. There are provided alignment marks 51b on both the right and left sides of the connection area formed by the leads 51a of the panel substrate 51. Image pickup devices 54 are used to monitor the alignment marks 51b and alignment marks 52b on the TAB tape 52 which are aligned therewith. The monitored images are observed or subjected to image processing to align the TAB tape 52 with the display panel 50 by means of an alignment mechanism (not shown) in a manner such that they are positioned in place.

After the alignment has been completed, the end portion of the panel substrate 51 and the end portion of the TAB tape 52 overlap each other with the ACF 53 being sandwiched therebetween. With this arrangement, a pre-attach pressure head 55 is pushed against the overlap to press and pre-attach the TAB tape 52 to the panel substrate 51 via the ACF 53.

After this pressure pre-attachment has been completed, the alignment marks are checked for any misalignment, and the end portions are checked for any dust particles as well. Then, only those panels which have passed these checks are sent to the subsequent process. In the process for final attachment by pressure, the pressure pre-attached portion is subjected to a predetermined temperature and a predetermined pressure for a predetermined period of time, so as to completely attach the TAB tape 52 to the panel substrate 51 by pressure.

However, it is still difficult to perfectly align the very closely spaced leads with each other even through the alignment using the aforementioned alignment marks because of a lack in resolution of the picked-up images or individual errors in the substrate glass, TAB tape, and FPC caused when they are formed. Additionally, in the pressure pre-attachment or the final pressure attachment process after alignment, dislocation or defective pressure attachment may occur to result in defective connection.

In particular, for a display panel such as an organic EL display panel including current injection display elements, even a slight dislocation may decrease the contact area between the interconnected leads, hence bringing about an adverse effect on the injection current. The decrease in contact area between the leads (even they are securely connected to each other) can degrade display performance. Accordingly, more precise alignment is required than by the voltage-driven liquid crystal display panel. In this context, for the organic EL display panel, at the first stage, panel substrates with TAB tapes having been pressure attached thereto are visually inspected and then rejected if they are so badly misaligned that their misalignment can be recognized visually. Then, the remaining panels are checked using a microscope to see if a proper contact area is left between every two mutually contacted leads.

Since the visual inspection using a microscope is a troublesome hard-load operation, it is therefore desired to check panels as small in number as possible using the microscope and thus reject as many panels as possible in the preceding visual inspection process. However, it is impossible to know thoroughly by the visual inspection whether the contact area is properly left between the leads. Additionally, the aforementioned alignment marks for alignment are too small to be used for the visual inspection to check for misalignment. As a result, only such obvious defectives as caused by the pressure attachment are removed in the visual inspection process, hence rendering the microscope inspection to remain unchanged.

SUMMARY OF THE INVENTION

The present invention was suggested to address these problems. It is therefore an object of the present invention to allow defective panels to be removed with high accuracy in a simple inspection process before the inspection using a microscope, thereby alleviating the load on the microscopic inspection.

To achieve the aforementioned object, the present invention provides the following features.

According to a first aspect of the present invention, there is provided a test mark provided on a connection for interconnecting at least two of a panel substrate, TAB tape, and flexible board of a display panel to check for any defect in the connection, characterized in that a test mark provided on each of the panel substrate, TAB tape, and flexible board is combined with another test mark to form a pair of marks, and the pair of marks is tested for electrical connection therebetween after having been connected together, thereby determining whether the interconnection is in a good state.

According to a second aspect of the present invention, the test for electrical connection is carried out by means of a test evaluation circuit to be connected to each of the marks.

According to a third aspect of the present invention, the test for electrical connection is carried out by turning on or off a light-emitting device to be connected to each of the marks.

According to a fourth aspect of the present invention, the light-emitting device is formed together with other display elements on the panel substrate of the display panel.

According to a fifth aspect of the present invention, the pair of marks comprises a pair of triangular marks with their apexes abutting each other.

According to a sixth aspect of the present invention, at least two pairs of marks are provided in a manner such that a distance between the apexes of one pair of marks is different from that of the other pair of marks when each pair of marks are connected together.

According to a seventh aspect of the present invention, a display panel, a TAB tape, or a flexible board, each being provided with the test mark according to any one of the first to sixth aspects of the invention.

According to each of the aforementioned aspects of the invention, the following effects are provided.

A conventional alignment mark is provided on a connection for interconnecting a display panel, a TAB tape, and a flexible board, respectively. However, the alignment mark is used for positioning the components upon their interconnection. In fact, the conventional alignment mark is too small to be employed as a test mark for checking whether the interconnection is good after the components have been connected together. The test mark according to the present invention allows a dislocation in the interconnection to be easily checked by testing the electrical connection between a pair of the test marks.

According to the test mark of the first aspect, a pair of test mark is tested for electrical connection therebetween after having been interconnected. The interconnection is determined to be good if electrical connection is found therebetween, whereas determined to be not good if no electrical connection is found therebetween. In this case, the mark formed on each of the components to be interconnected is conductive like electrodes provided on the connection. The marks are pressure attached to each other via an ACF to overlap each other, thereby ensuring electrical connection through the overlap. Furthermore, a pair of marks can be provided on both the right and left sides of the connection area, respectively, to determine the interconnection to be good when both the marks on the right and left are found to provide electrical connection.

According to the test mark of the second aspect, after the interconnection of the components, a terminal of the test evaluation circuit is connected to each marks. With this arrangement, the interconnection is determined to be good when the test evaluation circuit shows the electrical connection between the marks, whereas determined to be not good when it shows no electrical connection therebetween.

According to the test mark of the third aspect, a light-emitting device is connected to any one of marks. With this arrangement, after the interconnection of the components, power is supplied to the light-emitting device via the pair of marks. This allows the interconnection to be determined to be good when the light-emitting device is lit, whereas determined to be not good when the light-emitting device is not lit.

According to the test mark of the fourth aspect, the aforementioned light-emitting device used for testing is pre-fabricated as one member of display elements to be formed on the panel substrate of a display panel at the time of their fabrication. This eliminates the need of separately providing connection to the light-emitting device, thereby making the inspection efficient.

According to the test mark of the fifth aspect, a pair of test marks includes a set of triangular marks with their apexes abutting each other. This allows a slight dislocation to be detected as a defective electric connection, thereby providing improved test accuracy.

According to the test mark of the sixth aspect, at least two pairs of marks are provided in a manner such that a distance between the apexes of one pair of marks is different from that of the other pair of marks when each pair of marks are connected together. In this way, when no space is available to form the pair of marks on both the right and left of the connection area, the test marks can be provided only on one side of the connection area. This makes it possible to provide the same inspection effect as the pair of marks provided on both the right and left sides of the connection area.

According to the invention of the seventh aspect, by providing the aforementioned test mark for components, it is possible to provide improved efficiency to the inspection and the fabrication of an electronic device which has the components interconnected with a high reliability.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
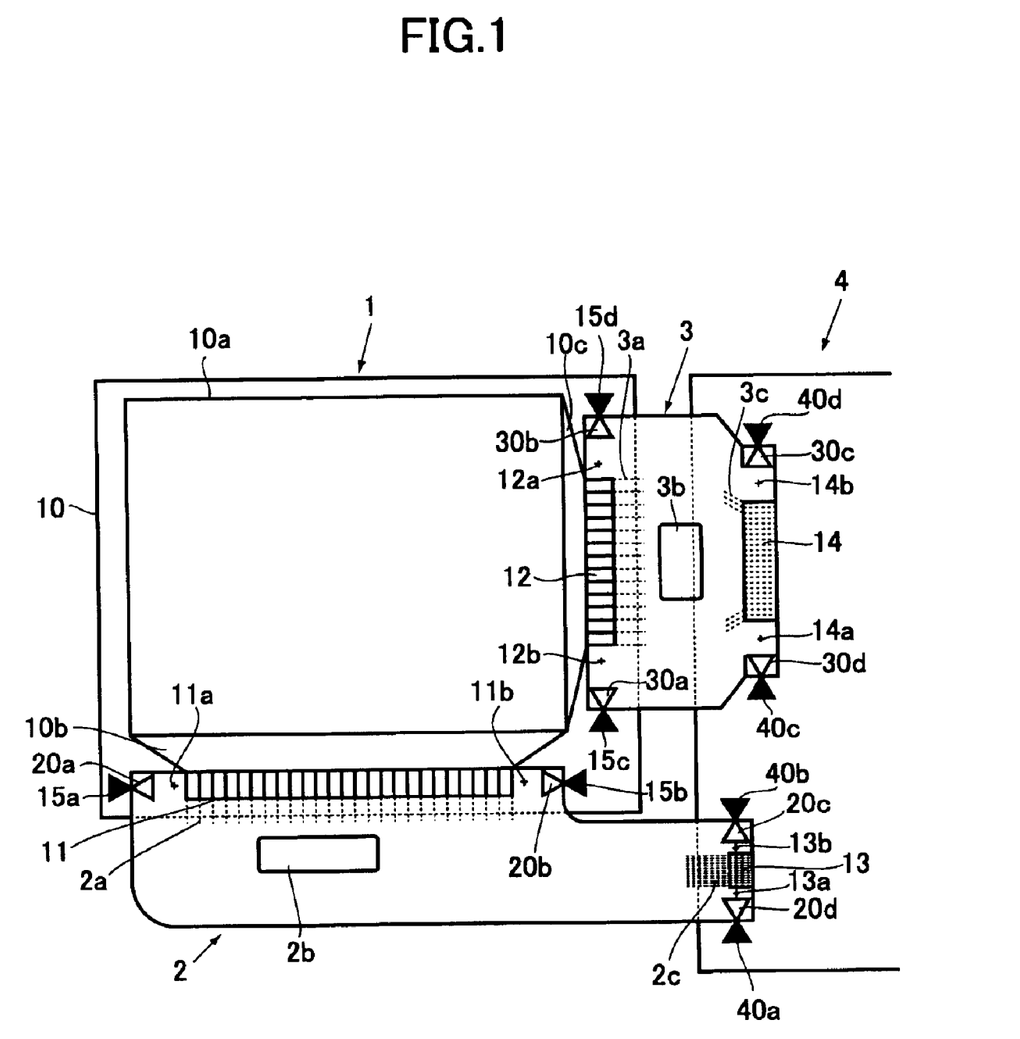
FIG. 1 is an explanatory view illustrating an embodiment of the present invention, showing electronic components mounted on a display panel and test marks arranged thereon.

Now, the present invention will be described below with reference to the accompanying drawings in accordance with the embodiments. FIG. 1 is an explanatory view illustrating an embodiment of the present invention, showing electronic components mounted on a display panel and test marks arranged thereon. As illustrated, there are provided an organic EL display panel 1, TAB tapes 2 and 3, and a flexible board 4.

A panel substrate 10 of the organic EL display panel 1 has signal lines or leads 10b, 10c extending from a display area 10a, in which the leads 10b and 10c are arranged in a closely spaced relation, respectively, to be connected to leads 2a and 3a of the TAB tapes 2 and 3 at connection areas 11 and 12, respectively. There are also provided ICs 2b and 3b which are bonded on the TAB tapes 2 and 3.

Leads 2c and 3c of the TAB tapes 2 and 3 on the side of the flexible board 4 are connected to connection lines of the flexible board 4 at connection areas 13 and 14 provided on the flexible board 4. In the vicinity of the aforementioned connection areas 11, 12, 13, and 14, provided are alignment marks 11a–11b, 12a–12b, 13a–13b, and 14a–14b on the panel substrate 10, the TAB tapes 2 and 3, and the flexible board 4, respectively.

In the embodiment of such a display panel, there are provided test marks on the panel substrate 10, the TAB tapes 2 and 3, and the flexible board 4, respectively. Test marks indicated by reference symbols 15a, 15b, 15c, and 15d are provided on the panel substrate 10. Test marks indicated by reference symbols 20a, 20b, 20c, and 20d are provided on the TAB tape 2. Test marks indicated by reference symbols 30a, 30b, 30c, and 30d are provided on the TAB tape 3. Test marks indicated by reference symbols 40a, 40b, 40c, and 40d are provided on the flexible board 4. These test marks are each made of an electrically conductive material, and designed to be pressure attached to each other via an ACF, thereby ensuring the overlap to be electrically conductive.

When properly mounted, the test marks are located on the right and left of the connection areas 11, 12, 13, and 14 symmetrically with respect to the centerline of each of the connection areas. Each test mark is formed in the shape of a triangle and connected to the other so as to form a pair of marks with the respective apexes abutting each other. Thus, the test marks are designed to sit on the right and left of each connection area to form a pair of test marks with the respective apexes abutting each other when properly connected. To arrange the test marks as described above, for example, the test marks should be designed such that their apexes sit on the line connecting between the alignment marks on each of the components.

Figure 2:
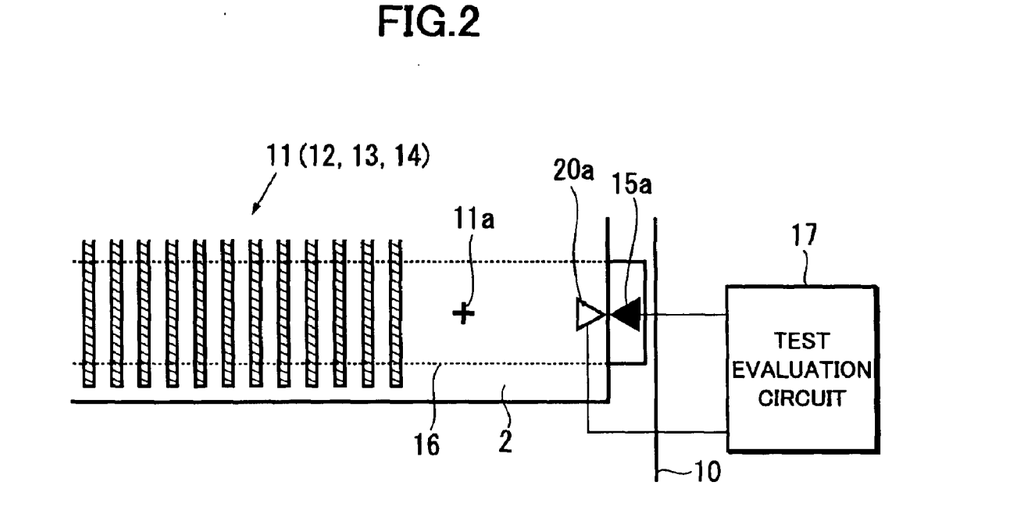
FIG. 2 is an explanatory view illustrating the structure of a connection area according to an embodiment.

Now, an example of a simple inspection using such test marks will be described with reference to FIG. 2. In this example, one side of the connection area 11 is shown; however, the same holds true for the other side and other connection areas. The TAB tape 2 is pressure attached to the panel substrate 10 via an ACF 16, while the test mark 20a on the TAB tape 2 and the test mark 15a on the panel substrate 10 are pressure attached to each other in the same manner. This allows an electrical connection to be established through the overlap between the test marks 15a and 20a. At the time of inspection, the test marks 15a and 20a are connected with a test evaluation circuit 17, which is in turn used to know whether the test marks 15a and 20a are in electrical communication with each other.

Figure 3:
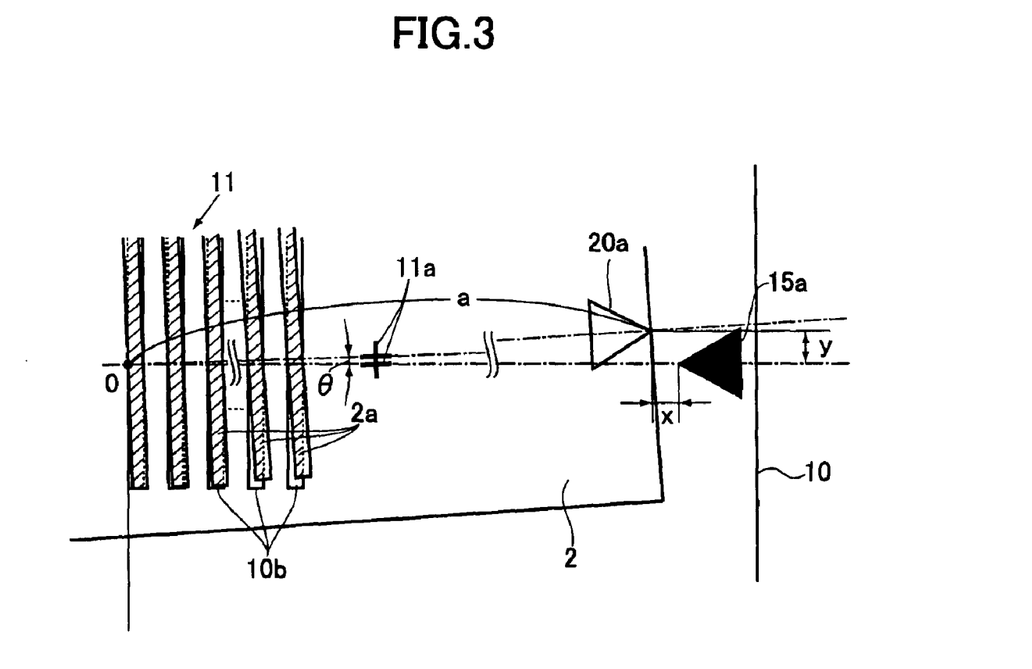
FIG. 3 is an explanatory view illustrating an embodiment of the present invention, showing the function of test marks.

Now, the functionality of such a test mark is described with reference to FIG. 3. The test mark 15a sits on the axis of the alignment mark 11a on the panel substrate 10, while the test mark 20a sits likewise on the axis of the alignment mark 11a on the TAB tape 2. In the connection area 11, it can be seen that the leads 2a on the TAB tape 2 are pressure attached to leads 10b on the panel substrate 10 via the ACF with an angle θ formed there between as a dislocation. This provides a significantly reduced contact area between the leads 10b and 2a as shown by shaded portions when compared with the proper connection. Since such an angular dislocation between the panel and the TAB tape has a significant effect on the display performance for the organic EL display panel 1, it is necessary to find and remove a panel having such an angular dislocation during the inspection process. However, for such small a dislocation as this, it is impossible to determine the dislocation only by visually inspecting the connection area 11 and the alignment mark 11a.

In contrast to this, the triangular test mark 20a is disposed at a predetermined distance a apart from the center O of the connection area 11 in the longitudinal direction of the connection area. This allows the slight angular dislocation θ to be magnified as the offset in the y direction, expressed by y=a·sin θ, thereby making it possible to recognize this enlarged offset. This offset causes the test marks with their apexes abutting each other to be spaced apart from each other, thereby providing no more electrical connection between the test marks. This is detected by means of the aforementioned test evaluation circuit 17 to thereby know the contact failure caused by the dislocation. In this way, it is possible to know a subtle angular dislocation by detecting the electrical conductivity between the test marks.

Furthermore, it is also possible to detect a dislocation which occurs in the longitudinal direction (i.e., the x direction) of the connection area, leaving a gap x between the apexes of the test marks 15a and 20a. However, for a dislocation in the x direction, suppose that electrical connection is detected between the test marks 15a and 20a on one side of the connection area 11. Even in this case, since the test mark 15a can be dislocated from the test mark 20a so as to overlap each other, it is necessary to detect the electrical connection between the test marks on the other side of the connection area 11 by connecting the test evaluation circuit 17 thereto. Therefore, a display panel can be accepted only when the electrical connection between the test marks is detected on both sides of the connection area using the test evaluation circuit 17 (being determined to be "good"). On the other hand, when no electrical connection between the test marks is detected on either side of the connection area, a display panel is determined to be "not good." Thus, the panel can be easily checked for any dislocation in the longitudinal direction (the x direction) of the connection area.

Figure 4:
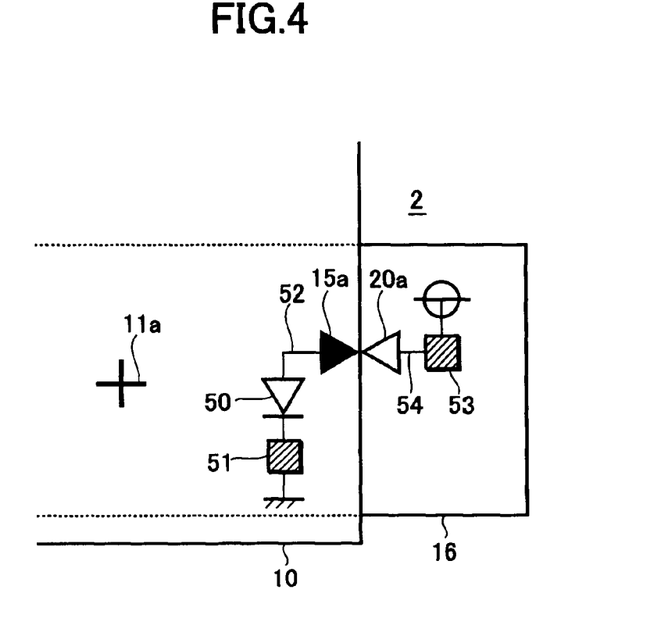
FIG. 4 is an explanatory view illustrating another embodiment.

FIG. 4 is an explanatory view illustrating another embodiment. In the aforementioned embodiment, the electrical connection between test marks is detected with the test evaluation circuit; however, in this embodiment, light-emitting devices are employed to visually check evaluation results. That is, like the embodiment as shown in FIG. 2, this embodiment is adapted such that the TAB tape 2 is pressure attached to the panel substrate 10 via the ACF 16, with the test mark 20a being formed on the TAB tape 2 and the test mark 15a being formed on the panel substrate 10. On the panel substrate 10, there is provided a light-emitting device 50 having a grounded power supply land 51, the light-emitting device 50 being connected to the test mark 15a via a trace 52. On the other hand, the TAB tape 2 has a power supply land 53 formed thereon, which is connected to the test mark 20a via a trace 54.

At the time of inspection, power is supplied to the power supply lands 51 and 53 via contact probes or pieces of conductive rubber. The test marks 15a and 20a, in electrical communication with each other with the apexes thereof abutting each other, would cause the light-emitting device 50 to be lit, thereby making it possible to visually know that there is no dislocation therebetween. This light-emitting device 50 may be formed separately after the panel substrate 10 has been formed. However, in the case of a panel substrate for mounting display elements, such as an organic EL display panel, it is also possible to form the light-emitting device 50 (for use in testing and serving as one of the display elements), at the same time these display elements are formed on the panel substrate.

Figure 5:
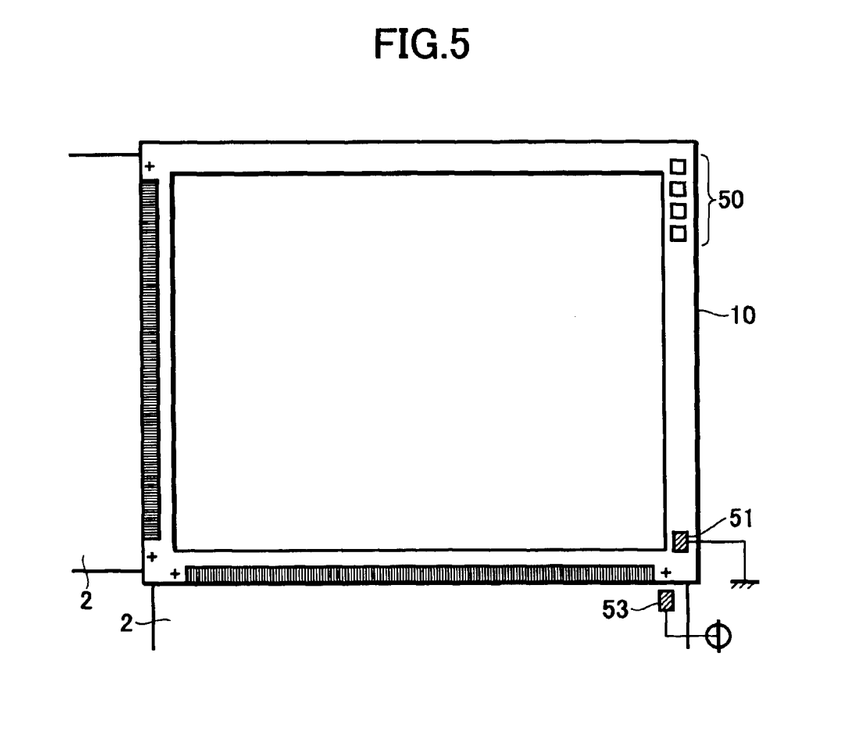
FIG. 5 is an explanatory view illustrating another embodiment.

In this embodiment, as shown in FIG. 5, the plurality of light-emitting devices 50 which are formed at each connection area in the previous embodiment are now arranged in a group within a limited area to improve the visibility of the light-emitting devices 50 at the time of inspection. To this end, the individually located test marks and the light-emitting devices 50 are connected to one another on the panel substrate 10 via connecting traces which are separately formed. To form a plurality of light-emitting devices 50, a pair of power supply lands 51 and 53 may be shared to allow traces extending to each light-emitting device therefrom to be formed on each of the substrate members.

Figure 6:
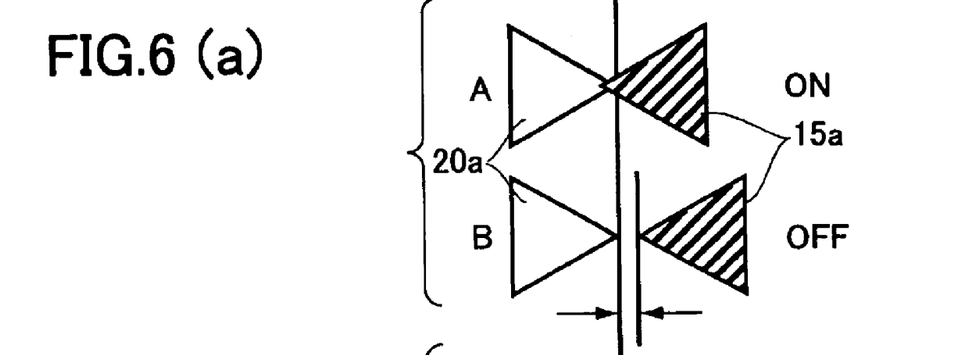
FIGS. 6(a) to 6(c) are explanatory views illustrating another embodiment.

FIG. 6 is an explanatory view illustrating another embodiment. In this embodiment, as the aforementioned pair of marks, two pairs of test marks 15a and 20a, or set A and B, are provided, in which one distance between two apexes is different from the other when test marks of each pair are connected to each other. As shown in FIG. 6(a), in this arrangement, the set A provides electrical connection (in an ON state) whereas the set B provides no electrical connection (in an OFF state). At this time, the overall connection is determined to be "good." In contrast to this, suppose that a dislocation has occurred in the leftward direction through the pressure attachment (see FIG. 6(b)) to cause both the sets A and B to provide electrical connection (in an ON state), and that a dislocation has occurred in the rightward direction through the pressure attachment (see FIG. 6(c)) to cause both the sets A and B to provide no electrical connection (in an OFF state), in both cases of which the overall connection is determined to be "not good." This arrangement allows the test marks to be provided on only one side of a connection area. Therefore, similar to an arrangement in which the test marks are formed on both sides of the connection area, it is thereby made possible to determine whether the interconnection is good or not by detecting a dislocation in the longitudinal direction of the connection area. In this way, the interconnection may be determined to be good or bad by means of the aforementioned test evaluation circuit 17 or the aforementioned light-emitting device 50.

Figure 7:
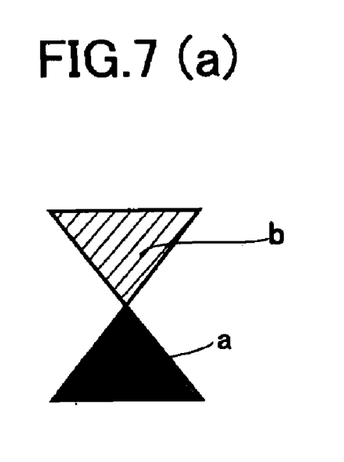
FIGS. 7(a) to 7(e) are views illustrating other arrangements which are applicable as the test marks of the present invention.

The test marks of the present invention are not limited to the aforementioned arrangement in which triangular marks are provided on the right and left to allow their apexes to abut each other. FIGS. 7(a)–7(e) are views illustrating other arrangements which can be used as the test marks in the present invention. The marks shown in FIG. 7(a) are triangular marks which are arranged vertically with their apexes abutting each other, the upper mark being provided on one of two mutually connected objects and the lower mark being provided on the other. Depending on the area allowed for the marks, they can be arranged vertically as in this example.

FIGS. 7(b) to 7(e) illustrate some other examples of marks in which mark a is provided on one connected object and mark b on the other. When both marks are properly spaced apart from each other in all the directions, no electrical connection is provided, whereas a dislocation therebetween would cause marks a and b to overlap each other, thereby establishing electrical connection therebetween. Accordingly, the interconnection is determined to be "not good" when electrical connection is provided therebetween.

Although each of the aforementioned embodiments has been described based on the connection between the panel substrate and the TAB tape, the present invention is also applicable in other combinations, such as a combination comprising a flexible board and a panel substrate including COGs (Chip On Glass).

Figure 8:
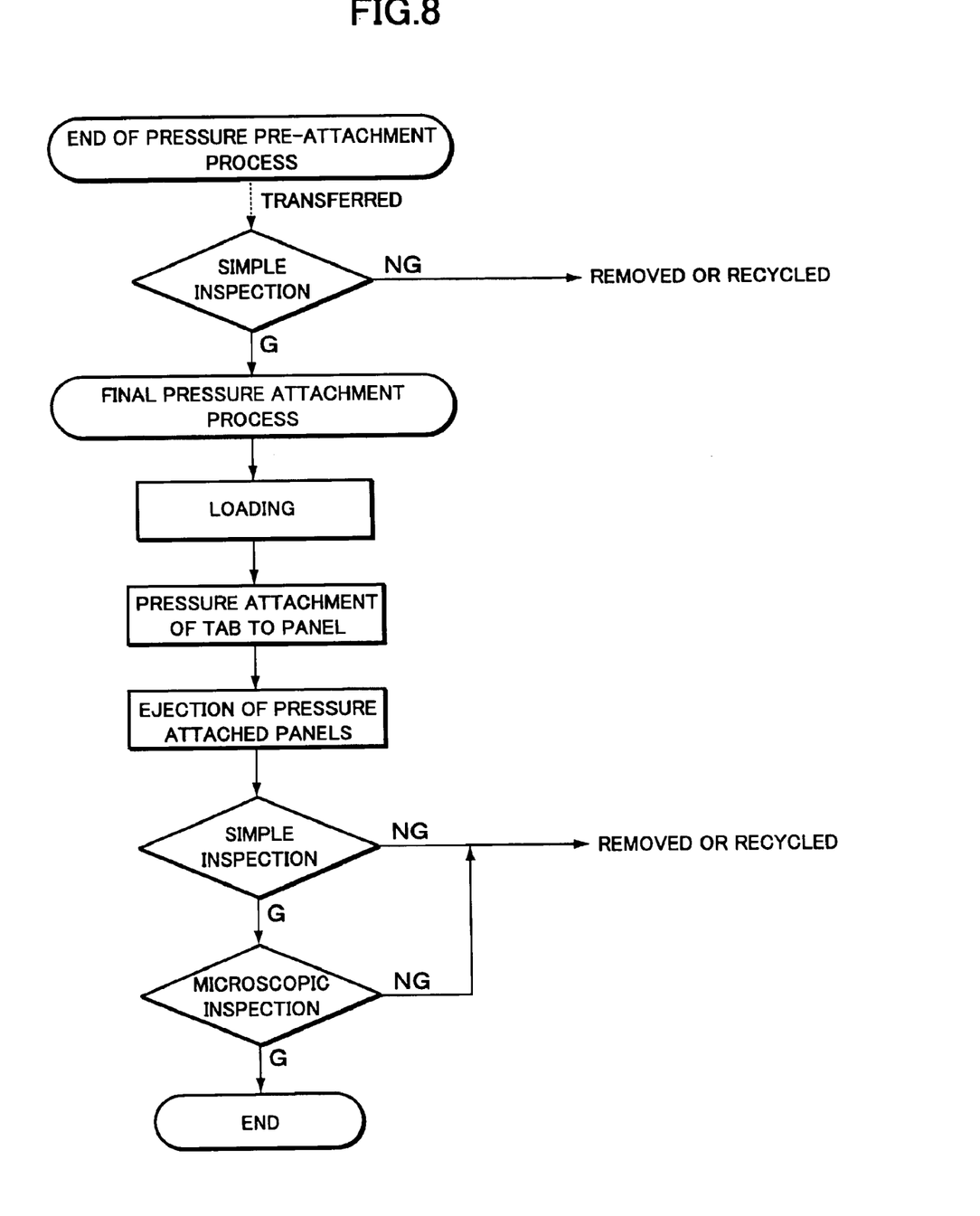
FIG. 8 is an explanatory flow chart showing the fabrication steps of an embodiment of the present invention.

Now, with reference to the flowchart shown in FIG. 8, the connection process including the inspection step in each of the aforementioned embodiments will be described below in accordance with an example of connecting TAB tapes to a panel substrate. As described in the aforementioned prior art, those panels with TAB tapes pressure pre-attached thereto are transferred into a final pressure attachment apparatus, but may be subjected to a simple inspection (if necessary) after the pressure pre-attachment process has been completed. This allows defective panels to be removed prior to the subsequent process, there by making it possible to alleviate the burden on the subsequent process.

As described above, the pressure pre-attached portion is subjected to a predetermined temperature and pressure for a predetermined period of time to finally pressure attach the TAB tapes 2 to the panel substrate 10 via the ACF within the connection area 11 (or 12). Those panels having been subjected to the final pressure attachment are ejected from the final pressure attachment apparatus, and then again subjected to a simple inspection. However, whether or not the simple inspection should be conducted can be determined depending on productivity.

In fact, this simple inspection is adapted to determine whether the interconnection is good by means of the aforementioned test evaluation circuit 17 or by means of the light-emitting device 50 being turned on or off. Those panels found in the simple inspection to have a dislocation (NG panels) are determined to be defective, and removed from the production line or recycled, whereas those which have passed the simple inspection (G panels) are subjected to the inspection using the microscope. The microscopic inspection is carried out on the contact area of the leads in the connection area 11 (or 12) in detail with reference to their microscopic images, allowing only those which meet the specified contact area to pass the simple inspection (G). On the other hand, those which do not meet this specification (NG) are determined to be defective, and removed from the production line or recycled.

These test marks are provided on the panel substrate 10, the TAB tapes 2 and 3, and the flexible board 4, respectively. This allows more percentage of defective panels to be found in the simple inspection, thereby reducing the burden on the inspection process using the microscope.

Since the present invention is adapted as described above, it is possible to found out defective panels with high accuracy in the simple inspection after the display panel, the TAB tapes, and the flexible board have been connected together. This mitigates the burden on the microscopic inspection, thereby rendering the entire inspection more efficient.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A device comprising: a test mark provided on a connection for interconnecting at least two components selected from among a panel substrate, a TAB tape, and a flexible board of a display panel to check for any defect in the connection, wherein at least one alignment mark is formed on each of said panel substrate, said TAB tape, and said flexible board, said test mark provided on each of said panel substrate, said TAB tape, and said flexible board is combined with another test mark to form a pair of marks, and the pair of marks is tested for electrical connection therebetween after having been connected together subsequent to said interconnection of said at least two components, thereby determining whether said interconnection is in a good state, each test mark is provided on an axis connecting said test mark with a corresponding alignment mark.

2. The device according to claim 1, wherein said test for electrical connection is carried out by means of a test evaluation circuit connected to each of said marks.

3. The device according to claim 1, wherein said test for electrical connection is carried out by turning on or off a light-emitting device connected to each of said marks.

4. The device according to claim 3, wherein said light-emitting device is formed together with other display elements on the panel substrate of the display panel.

5. The device according to any one of claims 1 to 4, wherein said pair of marks comprises a pair of triangular marks with their apexes abutting each other.

6. The device according to claim 5, wherein at least two pairs of marks are provided in a manner such that a distance between the apexes of one pair of marks is different from that of the other pair of marks when each pair of marks are connected together.

7. The device according to any one of claims 1 to 4, wherein said display panel, said TAB tape, or said flexible board, is provided with said test mark.

8. The device according to claim 5, wherein said display panel, said TAB tape, or said flexible board, is provided with said test mark.

9. The device according to claim 6, wherein said display panel, said TAB tape, or said flexible board, is provided with said test mark.

10. A device comprising: a test mark provided on a connection for interconnecting at least two components selected from among a panel substrate, a TAB tape, and a flexible board of a display panel to check for any defect in the connection, wherein said test mark provided on each of said panel substrate, said TAB tape, and said flexible board is combined with another test mark to form a pair of marks, and the pair of marks is tested for electrical connection therebetween after having been connected together subsequent to said interconnection of said at least two components, thereby determining whether said interconnection is in a good state, wherein
said test for electrical connection is carried out by turning on or off at least one organic electroluminescent device connected to each of said marks, and
said light-emitting device is formed together with other display elements on the panel substrate of the display panel.

11. A device comprising: a test mark provided on a connection for interconnecting at least two components selected from among a panel substrate, a TAB tape, and a flexible board of a display panel to check for any defect in the connection, wherein said test mark provided on each of said panel substrate, said TAB tape, and said flexible board is combined with another test mark to form a pair of marks, and the pair of marks is tested for electrical connection therebetween after having been connected together subsequent to said interconnection of said at least two components, thereby determining whether said interconnection is in a good state, wherein
said pair of marks comprises a pair of triangular marks with their apexes abutting each other.

12. A device comprising: a test mark provided on a connection for interconnecting at least two components selected from among a panel substrate, a TAB tape, and a flexible board of a display panel to check for any defect in the connection, wherein said test mark provided on each of said panel substrate, said TAB tape, and said flexible board is combined with another test mark to form a pair of marks, and the pair of marks is tested for electrical connection therebetween after having been connected together subsequent to said interconnection of said at least two components, thereby determining whether said interconnection is in a good state, wherein
at least two pairs of marks are provided in a manner such that a distance between the apexes of one pair of marks is different from that of the other pair of marks when each pair of marks are connected together.

* * * * *